US006833763B2

(12) United States Patent
Chung (10) Patent No.: US 6,833,763 B2
(45) Date of Patent: Dec. 21, 2004

(54) CDR LOCK DETECTOR WITH HYSTERESIS

(75) Inventor: David Kyong-sik Chung, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/829,755

(22) Filed: Apr. 22, 2004

(65) Prior Publication Data

US 2004/0196106 A1 Oct. 7, 2004

Related U.S. Application Data

(63) Continuation of application No. 10/335,190, filed on Dec. 30, 2002, now Pat. No. 6,747,518.

(51) Int. Cl.[7] .............................................. H03L 7/095
(52) U.S. Cl. ................................ 331/1 A; 331/DIG. 2
(58) Field of Search ............................ 331/1 A, 16–18, 331/25, DIG. 2; 327/156–159; 332/127; 360/51; 375/376; 455/260

(56) References Cited

U.S. PATENT DOCUMENTS 6,314,150 B1 * 11/2001 Vowe ......................... 375/374
6,621,352 B2    9/2003 Matsumoto et al.

* cited by examiner

*Primary Examiner*—David Mis
(74) *Attorney, Agent, or Firm*—Christie, Parker & Hale, LLP (57) ABSTRACT

A lock-detect circuit is configured to detect whether an incoming signal has acquired a lock to a reference signal using a first frequency detect window and to detect whether the incoming signal has lost a previously acquired a lock to the reference signal using a second frequency detect window different from the first frequency detect window. The two signals are applied to two different down-counters that are first synchronized before initiating their count-downs. If the offset between the counts of the two counters is less than the first frequency detect window, the incoming signal is detected as having acquired a lock to the reference signal. If the offset between the counts of the two counters is greater than the second frequency detect window, the incoming signal is detected as having lost its previously acquired lock to the reference signal.

12 Claims, 6 Drawing Sheets

CDR LOCK DETECTOR WITH HYSTERESIS

CROSS-REFERENCE TO RELATED APPLICATION(S)

This application is a continuation of U.S. patent application Ser. No. 10/335,190, filed Dec. 30, 2002, now U.S. Pat. No. 6,747,518, the disclosure of which is hereby incorporated by reference in its entirety for all purposes.

BACKGROUND OF THE INVENTION

The present invention relates to electronic circuits, and more particularly to locking and unlocking of data to a reference clock signal in a clock and data recovery system.

The increasing speed with which multiple types of data, such as text, audio and video, are transported over existing communication networks has brought to the fore the reliability with which such data transportation is carried out. In accordance with one conventional method, to ensure reliable data transfer, the data is first encoded with a reference clock signal at the transmitting end of the network to generate a composite signal. Thereafter, the composite signal is transmitted over the network to the receiving end. At the receiving end, the data and clock signals are recovered from the composite signal to ensure that the data and clock signals remain synchronous with respect to each other.

Figure 1:
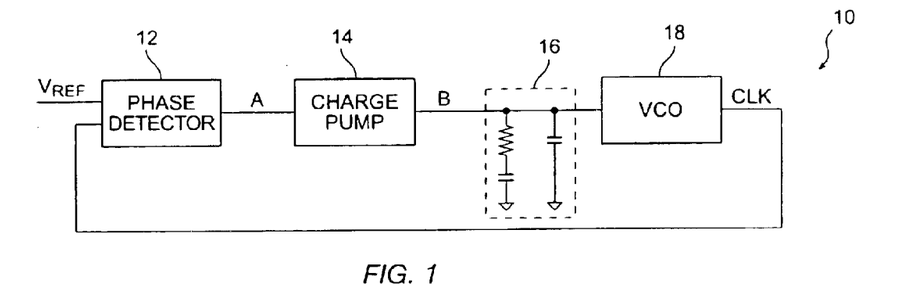
FIG. 1 is a simplified block diagram of a phase locked loop, as known in the prior art.

The clock and data recovery is typically carried out, for example, by a delay locked loop or a phase locked loop. In operation, a phase locked loop maintains a fixed relationship between the phased and frequency of the signal it receives and those of the signal it generates. FIG. 1 is a simplified block diagram of a conventional phase locked loop (PLL) 10 adapted to maintain a fixed relationship between the phase and frequency of signal CLK and signal Vref. PLL 10 includes, among other components, phase detector 12, charge pump 14, loop filter 16 and voltage controlled oscillator (VCO) 18. The extracted clock signal Clk is supplied at the output terminal of VCO 18. Once in a locked state, the phase and frequency of signal Clk generated by PLL 10 is locked to those of signal Vref received by PLL 10. The operation of PLL 10 is described further below.

Phase detector 12 receives signals Vref and Clk, and in response, generates signal A that corresponds to the difference between the phases of these two signals. Charge pump 14 receives signal A and in response generates current signal I whose magnitude varies depending on the magnitude of signal A. Loop filter 16 filters out the high frequency components of signal I and delivers the filtered-out signal to VCO 18.

If signal Vref leads signal Clk in phase—indicating that the VCO is running relatively slowly-signal A causes charge pump 14 to increase its output current I until VCO 18 achieves an oscillation frequency at which signal Clk is frequency-locked and phase-locked with signal Vref. If, on the other hand, signal Vref lags signal Clk in phase—indicating that the VCO is running relatively fast—signal A causes charge pump 14 to reduce its output current I until VCO 18 achieves an oscillation frequency at which signal Clk is frequency-locked and phase-locked with signal Vref. Signal Clk is considered to be locked to signal Vref if its frequency is within a predetermined frequency range of signal Vref. Signal Clk is considered to be out-of-lock with signal Vref if its frequency is outside the predetermined frequency range of signal Vref.

Figure 2:
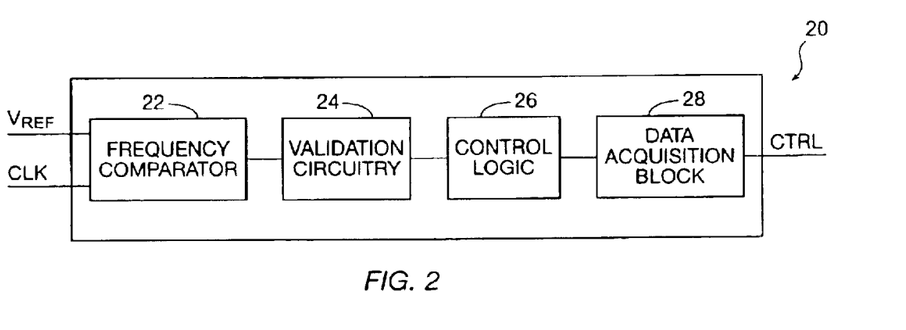
FIG. 2 is a simplified block diagram of a lock-detect circuit, as known in the prior art.

FIG. 2 is a schematic block diagram of a lock-detect circuitry 20 adapted to detect whether signal Clk is in-lock or out-of-lock with signal Vref. Lock-detect circuitry 20 includes, in part, a frequency comparator 22, a validation circuitry 24, a control logic 26 and a data acquisition block 28. Frequency comparator 22 compares the frequencies of signals Vref and Clk and generates a window (i.e., a pulse) whose width corresponds to a predetermined value. Validation circuitry receives the window generated by frequency comparator 22 and determines whether the frequency differential (i.e., offset) between signals Clk and Vref is greater or less than this window. If the offset between frequencies of signals Vref and Clk is less than the generated window, control logic block 26 generates a control signal to indicate that signal Clk is locked to signal Vref. The control signal generated by control logic 26 is applied to data acquisition block 28. After receiving this control signal, data acquisition block 28 switches to data acquisition mode at which point signal Clk is generated from an incoming data (not shown) and is again required to maintain lock to signal Vref.

Therefore, when lock-detect circuitry 20 switches to data acquisition mode, signal Clk despite being within the predetermined frequency range of signal Vref, may lose its lock as its frequency is now dependent on the frequency of the incoming data. If signal Clk loses its lock, lock-detect circuitry 20 switches from data acquisition mode back to frequency lock mode so as to enable signal CLK to reacquire its lock to signal Vref for a second time. The difference between frequencies of signals Vref and Clk during the second lock is often less than the difference between frequencies of these two signals during the first lock. However, signal Clk may lose its lock again. This second loss of lock may result, for example, from data jitter. The process of locking and unlocking may continue for some time until signal Clk acquires a frequency sufficiently close to that of signal Vref that it remains locked to signal Vref. Prior art lock detectors, such as the one shown in FIG. 2, use the same window for detecting in-lock and out-of-lock conditions. Therefore, the detector may experience a number of in-lock and out-of-lock conditions before the detector acquires and maintains a stable lock. Furthermore, the windows used by prior art lock detectors are fixed and may not be selectively changed by the user.

A need continues to exist for a lock-detect circuitry adapted to more reliably lock the frequency of an incoming data signal to that of a reference clock signal.

BRIEF SUMMARY OF THE INVENTION

In accordance with the present invention, a lock-detect circuit is configured to detect whether an incoming signal has acquired a lock to a reference signal using a first frequency detect window and to detect whether the incoming signal has lost a previously acquired lock to the reference signal using a second frequency detect window different from the first frequency detect window. The frequency detect window used to detect lock acquisitions (i.e., in-lock conditions) is typically selected to be narrower than that used to select lock losses (i.e., out-of-lock conditions). The use of dual frequency detect windows in detecting in-lock and out-of-lock conditions, in accordance with the present invention, decreases the number of in-lock/out-of-lock transitions and increases the reliability with which in-lock conditions are detected.

In some embodiments of the present invention, the lock-detect circuit includes a hysteresis-enabled frequency comparator block, a validation block, a control logic block and a data acquisition block. The lock-detect circuitry is adapted to first detect whether a signal generated by a voltage-controlled oscillator (VCO) is frequency-locked to a reference clock. If such a lock is detected, the lock-detect circuitry switches to data acquisition mode to detect whether an incoming data is locked to the reference clock. If the incoming data is detected as being locked to the reference clock, the lock-detect circuit generates a control signal to so indicate.

The frequency comparator includes, in part, a binary down-counter driven by the VCO clock and a binary down-counter driven by the reference clock. The two down-counters decrement from their maximum value after being synchronized. If the VCO and reference clocks have the same frequency, the two counters reach the same count at the same time. If there is an offset between the frequencies of these two clock signals, the counts of the two counters begin to diverge. A decoder decodes a multitude of the bits of the VCO counter to generate pulses whose widths corresponds to the frequency detect windows. In some embodiments, an optional signal disables the hysteresis thus requiring the lock-detect circuit to detect both in-lock and out-of-lock conditions using the same frequency detect window. In yet other embodiments, the frequency detect window used to detect in-lock conditions as well as the frequency detect window used to detect out-of-lock conditions are programmable.

The validation circuit includes a number of flip-flops that are configured to detect whether the offset between the frequencies of the VCO and reference clocks is less or greater than the width of the generated pulses. If the offset between the frequencies of the VCO and reference clocks is less than the width of a selected one of the generated pulses, the validation circuit asserts an associated lock-detect signal to indicate that a lock has been acquired or a previously acquired lock remains active. If, on the other hand, the offset between the frequencies of the VCO and the reference clocks is greater than the width of a selected one of the generated pulses, the validation circuit desserts the associated lock-detect signal to indicate that no lock is acquired lock or a previously acquired lock is lost.

The lock-detect signal generated by the validation circuit is applied to the control logic block which is adapted to verify that the reference clock signal is active. If the reference clock signal is active, the control logic block declares the lock-detect signal as valid. If, on the other hand, the reference clock signal is inactive, the control logic block inhibits the lock-detect signal from becoming valid.

The data acquisition block is adapted to indicate whether the incoming data is locked to the reference clock after the lock-detect circuit switches to data acquisition mode. The data acquisition block receives the declared lock-detect signal generated by the control logic and waits for a time period to determine whether a previously acquired lock is lost. If during this period the lock is not lost, the data acquisition block asserts a signal to indicate the data is locked to the reference clock signal. Otherwise, the data acquisition block desserts the signal to indicate that the data is not locked to the reference clock signal. In some embodiments, the data acquisition block includes a number of flip-flops and inverters and the wait period is equal to two full count-down cycles of the reference clock counter.

The following detailed descriptions and the accompanying drawings provide a better understanding of the nature and advantages of the of the present invention.

DETAILED DESCRIPTION OF THE INVENTION

Figure 3:
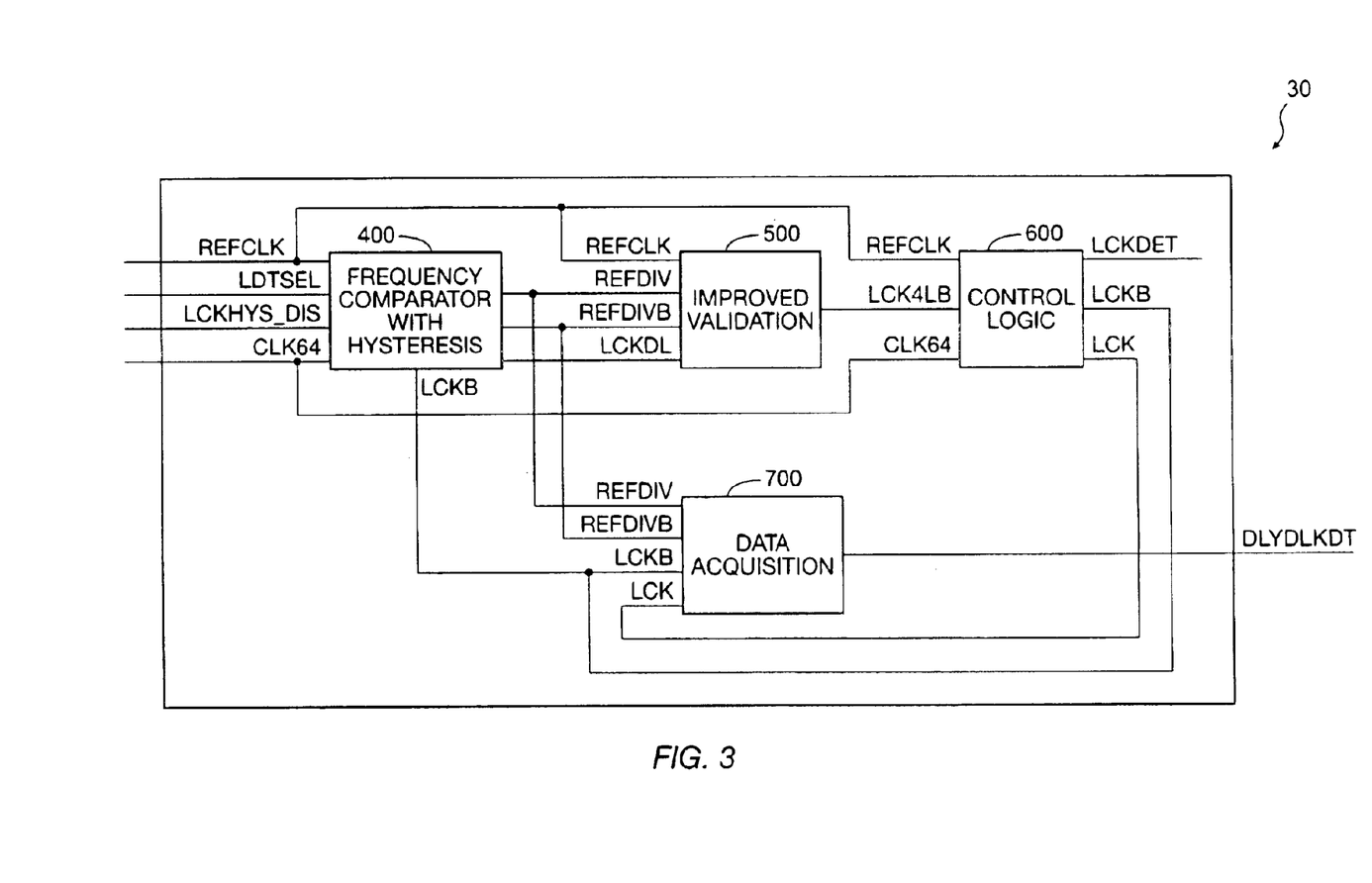
FIG. 3 is a simplified block diagram and associated signals of a lock-detect circuit, in accordance with one embodiments of the present invention.

FIG. 3 is a simplified high level block diagram of lock-detect circuitry 30, in accordance with one embodiment of the present invention. Lock-detect circuitry 30 includes, in part, a hysteresis-enabled frequency comparator block 400, a validation block 500, a control logic block 600 and a data acquisition block 700. Lock-detect circuitry 30 receives signals REFCLK, LDTSEL, LCKHYS_DIS and CLK64 and generates signals LCKDET and DLYDLKDT. Lock-detect circuitry 30 is adapted to first detect whether signal CLK64 is frequency-locked to signal REFCLK during the frequency lock mode. If such a lock is detected, lock-detect circuitry 30 asserts LCKDET and switches to data acquisition mode.

During the data acquisition mode, signal CLK64 is generated from an incoming data signal. Accordingly, lock-detect circuit 30 detects whether signal CLK64—as generated from the incoming data—remains frequency-locked to signal REFCLK. If signal CLK64 remains locked to signal REFCLK during the data acquisition mode, lock-detect circuit 30 asserts signal DLYDLKDT. The operation of each of the blocks disposed in lock-detect circuitry 30 is described further below.

Figure 4:
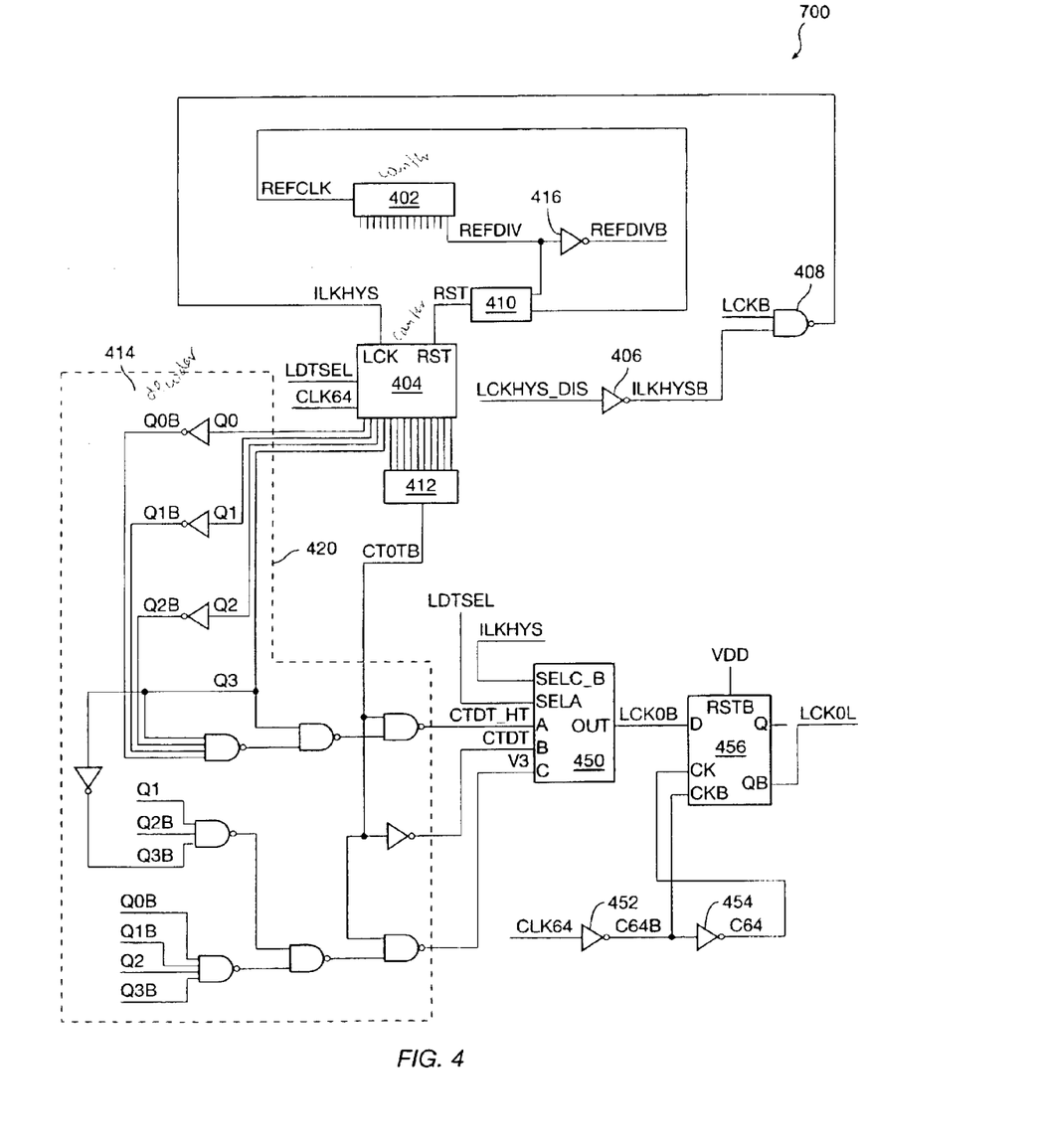
FIG. 4 is a logic gate diagram of the frequency comparator of FIG. 3, in accordance with one embodiment of the present invention.

FIG. 4 shows the various logic gates that are disposed in hysteresis-enabled frequency comparator 400 (hereinafter frequency comparator 400), in accordance with one embodiment of the present invention. Frequency comparator 400 receives signals REFCLK, LDTSEL, LCKHYS_DIS, CLK64, and in response, generates signals REFDIV, REFDIVB and LCK0L.

Frequency comparator 400 is shown as having counters 402, 404, inverter 406, NAND gate 408, step detector 410, NOR gate 412, decoder 414—which is shown inside dashed perimeter line 420—inverter 416, multiplexer 450, flip-flop 456 and inverters 452 and 454. Frequency comparator 400 is configured to synchronize binary down-counter 404 that is driven by signal CLK64 to binary down-counter 402 that is driven by signal REFCLK. If signals CLK64 and REFCLK have the same frequency, counters 402 and 404 reach the same count at the same time. If there is an offset between the frequencies of signals CLK64 and REFCLK, the counts of counters 402 and 404 begin to diverge. If the divergence between the counts of the two counters is within a predefined range (i.e., the frequency detect window) the two signals are detected as being in-lock, otherwise they are detected as being out-of-lock. To enable this detection, decoder 414 decodes the least significant bits of counter 404 to generate a pulse having a width that corresponds to the frequency detect window. Signal LDTSEL together with signal ILKHYS select the pulse width that is used in detecting in-lock and out-of-lock conditions, as described further below.

Signal LCKHYS_DIS is applied to inverter 406 which has an output terminal coupled to an input terminal of a two-input NAND gate 408. The other input terminal of NAND gate 408 receives signal LCKB that is supplied by control logic 600. NAND gate 408 generates signal ILKHYS that is applied to counter 404. Signal LCKHYS_DIS is user configurable and either disables or enables hysteresis in lock detect circuitry 30. When signal LCKHYS_DIS is in a high logic state (i.e., is high), signal ILKHSY is forced to a logic high, thereby configuring (i.e., placing) lock-detect circuitry 30 in non-hysteresis mode.

When lock-detect circuitry 30 is in the non-hysteresis mode, signal LDTSEL selects the frequency detect window (alternatively referred to hereinbelow as the detect threshold window or threshold value). If signal LDTSEL is set to a logic high, a relatively smaller detect threshold window is selected. If signal LDTSEL is set to a logic low, a relatively larger detect threshold window is selected. The selected detect threshold window is used for detecting both in-lock and out-of-lock conditions in the non-hysteresis mode.

Lock detect circuitry 30 is placed in a hysteresis mode if signal LCKHYS_DIS is set to a low logic state. In accordance with the present invention, when lock-detect circuitry 30 is in the hysteresis mode, a first detect threshold window is used to detect whether signal CLK64 is locked to signal REFCLK and a second detect threshold window is used to detect whether signal CLK64 is out-of-lock with signal REFCLK. If lock-detect circuitry 30 is in an out-of-lock state, then the smaller of the two detect threshold windows is dynamically selected to detect whether signal CLK64 is locked to signal REFCLK. If, on the other hand, lock-detect circuitry 30 is an in-lock state, then the larger of the two detect threshold windows is dynamically selected to detect whether signal CLK64 is out-of-lock with signal REFCLK.

Signal REFCLK is applied to and thus drives counter 402. In the exemplary embodiment shown above, counter 402 is a 14-bit down-counter. Counter 402 decrements from the maximum initial value of $2^{14}$ (i.e., 3FFF Hexadecimal) with each rising (or falling) transition of signal REFCLK. It is understood, however, that in other embodiments counter 402 may have higher or lower number of bits and may be an up-counter. When counter 402 reaches the count of 0, signal REFDIV which carries the most significant bit (MSB) of counter 402 is set to 0. With the next transition on signal REFCLK, signal REFDIV returns to 1. Signals REFDIV and REFCLK are supplied to step detector 410. When step detector 410 receives a transition on signal REFDIV, it generates an output pulse RST that is applied to the reset input terminal of counter 404. Signal REFCLK is used to generate an RST pulse having a width that is equal to one period of signal REFCLK.

Counter 404 is also a 14-bit down counter that decrements from the maximum initial value of $2^{14}$ with each rising (or falling) transition of signal CLK64. Counter 404 initiates its count-down after receiving a transition on signal RST generated by step detector 410. Accordingly, after being reset by step detector 410, counters 402 and 404 are synchronized before beginning to count down from 3FFF hex. As seen from FIG. 4, the 10 MSBs of counter 404 are applied to 10-input NOR gate 412. When counter 404 reaches a count of 000F hex, i.e., all the 10 bits applied to NOR gate 412 are 0, signal CT0TB generated by NOR gate 412 is set to 1.

The four least significant bits (LSBs) of counter 404 are applied to decoder 414 which is shown inside dashed perimeter line 420. Decoder 414 includes a multitude of inverters and NAND gates that are configured to decode the presence of various LSBs of counter 404 and to cause pulses of various widths to appear at the input terminals A, B and C of multiplexer 450. Decoder 414 is configured to cause a pulse having a width equal to nine cycles of signal CLK64 to appear on signal CTDT_HT—signal CTDT_HT is applied to data input terminal A of multiplexer 450. Because signals VREF and CLK64 are not synchronous with respect to each other, the effective width of this pulse is equal to eight cycles of signal CLK64. As is understood by those skilled in the art, eight out of $2^{14}$ cycles of signal CLK64 represent 488 parts per million (ppm)—approximately 480 ppm (±240 ppm). Decoder 414 is also configured to cause a pulse having a width equal to approximately 960 ppm (±480 ppm) of clock signal CLK64 to appear on signal CTDT. Signal CTDT is applied to data input terminal B of multiplexer 450. Decoder 414 is also configured to cause a pulse having a width equal to approximately 120 ppm (±60 ppm) of clock signal CLK64 to appear on signal V3. Signal V3 is applied to data input terminal C of multiplexer 450. Detect threshold windows of 120, 480 and 960 ppm begin when counter 404 has respectively 2, 8 and 16 cycle left before reaching count 0, and end when counter 404 reaches count 0.

As described above, if signal LCKHYS_DIS is selected to be high (i.e., when lock-detect circuit 30 is selected not to have hysteresis) the same frequency detect window and thus the same pulse width is used in detecting whether a lock has been acquired or a previously acquired lock is lost. If signals LCKHYS_DIS and LDTSEL are respectively selected to be in high and low logic states, a frequency detect window of ±480 ppm is selected for detecting whether a lock has been acquired or a previously acquired lock is lost. If signals LCKHYS_DIS and LDTSEL both are selected to be high, the a frequency detect window of ±240 ppm is selected for detecting whether a lock has been acquired or a previously acquired lock is lost.

If signal LCKHYS_DIS is selected to be low (i.e., when lock-detect circuit 30 is placed in the hysteresis mode) and signal LDTSEL is selected to be low, a frequency detect window of ±480 ppm is selected for detecting whether a previously acquired lock is lost and a frequency detect window of ±60 ppm is selected for detecting whether a lock has been acquired. If signals LCKHYS_DIS and LDTSEL are respectively selected to be low and high, a frequency detect window of ±240 ppm is selected for detecting whether a previously acquired lock is lost and a window of ±60 ppm is selected for detecting whether a lock has been acquired. It is understood that the frequency detect windows set for detecting in-lock and out-of-lock conditions and corresponding to ±60, ±240 and ±480, as described above are merely exemplary. Other embodiments may have frequency detect windows that are larger or smaller than the above values. It is further understood that other embodiments of lock-detect circuit 30 may be configured to have a programmable frequency detect window for detecting both in-lock as well as out-of-lock conditions.

Signals LDTSEL and ILKHYS are applied to select input terminals SELA and SELC_B of multiplexer 450. If both signals LDTSEL and ILKHYS are high, multiplexer 450 passes signal CTDT_HT present on its input terminal A to its output terminal OUT. If signal LDTSEL is low and signal ILKHYS is high, multiplexer 450 passes signal CTDT present on its input terminal B to its output terminal OUT. If signal ILKHYS is low, multiplexer 450 passes signal V3 present on its input terminal C to its output terminal OUT.

Therefore, assuming signals LCKHYS_DIS and LDTSEL are respectively selected to be in low and high logic states, to determine if signal CLK64 has lost a previously acquired lock to signal REFCLK, a pulse having a width corresponding to ±240 ppm of CLK64 appears on signal LCK0B. Assuming that signals LCKHYS_DIS and LDTSEL are selected to be in low logic states, to determine if signal CLK64 has lost a previously acquired lock to signal REFCLK, a pulse having a width corresponding to ±480 ppm of CLK64 appears on signal LCK0B. Assuming signal LCKHYS_DIS is selected to be in a low logic state, to determine if signal CLK64 has acquired a lock to signal REFCLK, a pulse having a width corresponding to ±60 ppm of CLK64 appears on signal LCK0B. If signal LCKHYS_DIS is selected to be in a high logic state, a pulse having a width corresponding to ±240 ppm (if signal LDTSEL is high) or ±480 ppm (if signal LDTSEL is low) of signal CLK64 appears on signal LCK0B to determine whether signal CLK64 has acquired a lock or has lost a previously acquired lock to signal REFCLK.

Signal LCK0B is applied to data input terminal D of flip-flop 456 which includes two input clock terminals CK and CKB. Clock input terminal CKB of flip-flop 456 receives signal C64B generated by inverter 452 which, in turn, receives input signal CLK64. Clock input terminals CK of flip-flop 456 receives signal C64 generated by inverter 454 which, in turn, receives input signal C64. Flipflop 456 generates signal LCK0L at its output terminal QB. Signal LCK0L is a delayed replica of signal LCK0B except that it does not have any glitches that may appear on signal LCK0B due to race conditions generated by decoder 420.

Figure 5:
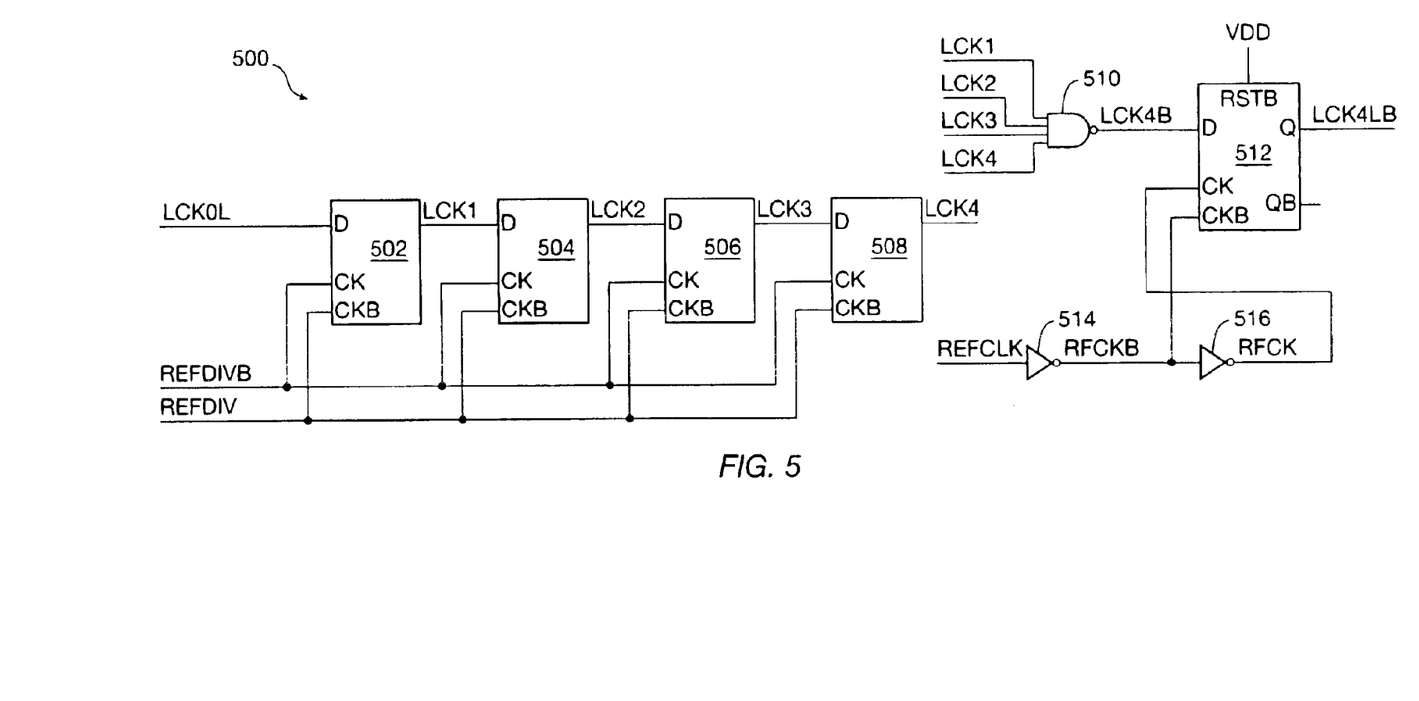
FIG. 5 is a logic gate diagram of the validation circuit of FIG. 3, in accordance with one embodiment of the present invention.

FIG. 5 shows the various logic gates disposed in validation circuit 500, in accordance with one embodiment of the present invention. Validation circuit 500 includes flip-flops 502, 504, 506, 508, NAND gate 510, inverters 514, 516 and flip-flop 512. Validation circuit 500 receives signals REFCLK, REFDIV, REFDIVB, LCK0L and, in response, generates signal LCK4LB. Signal LCK0L is applied to data input terminal D of flip-flop 502. Signals REFDIV and REFDIVB are respectively applied to clock input terminals CKB and CK of flip-flops 502, 504, 506 and 508. Signal REFCLK is applied to the input terminal of inverter 514. Signal LCK1 generated at output terminal Q of flip-flop 502 is applied to input terminal D of flip-flop 504. Signal LCK2 generated at output terminal Q of flip-flop 504 is applied to input terminal D of flip-flop 506. Signal LCK3 generated at output terminal Q of flip-flop 506 is applied to input terminal D of flip-flop 508. Flip-flop 508 generates signal LCK4. Signals LCK1, LCK2, LCK3 and LCK4 are respectively applied to input terminals A, B, C and D of 4-input NAND gate 510.

If signals REFCLK and CLK64 have the same frequency, a transition occurs on each of signals REFDIV and REFDIV near the center of the pulse signal LCK0L, thereby causing signal LCK0L to be clocked in flip-flop 502. So long as the offset (i.e., the difference) between frequencies of signals REFCLK and the CLK64 is less than LCK0L pulse width—as defined by the frequency detect window—a transition (i.e., edge) occurs on each of signals REFDIV and REFDIVB while the LCK0L pulse is present, thereby causing signal LCK0L to be clocked in flip-flop 502. If, on the other hand, the offset between frequencies of signals REFCLK and the CLK64 is greater than or equal to LCK0L pulse width, neither of signals REFDIV and REFDIVB include an edge while the LCK0L pulse is present and thus signal LCK0L is not clocked in flip-flop 502.

For example, assume that signal CLK64 is acquiring a lock to signal REFCLK and signal LCKHYS_DIS is in a low logic state. In accordance with the present invention, signal CLK64 is considered to have acquired a lock to (i.e., is in-lock with) signal REFCLK if the frequency offset between signals CLK64 and REFCLK is ±60 ppm. To detect if a lock has been acquired, frequency comparator 400 generates and delivers a pulse having a width of 120 ppm to signal LCK0L. If the offset between frequencies of signals CLK64 and REFCLK is less than ±60 ppm, an edge appears on each of signals REFDIV and REFDIVB while the pulse LCK0L is present to register (i.e., to clock in) this pulse in flip-flop 502. If the offset between frequencies of signals CLK64 and REFCLK is greater than or equal to ±60 ppm, no edge appears on signals REFDIV and REFDIVB while pulse LCK0L is present, and therefore this pulse is not registered in flip-flop 502.

Assume further that signal CLK64 is locked to signal REFCLK and signal LCKHYS_DIS is in a low logic state. In accordance with present invention, signal CLK64 is detected as having gone out-of-lock with (i.e., having lost its previously acquired lock to) signal REFCLK if the frequency offset between signals CLK64 and REFCLK is ±480 ppm cycles (when signal LDTSEL is set to a low logic state). To detect if signal CLK64 has lost its previously acquired lock to signal REFCLK, frequency comparator 400 generates and delivers a pulse having a width of 960 ppm to signal LCK0L. If the frequency offset between signals CLK64 and REFCLK is less than ±480 ppm, an edge appears on each of signals REFDIV and REFDIVB while pulse LCK0L is present to register this pulse in flip-flop 502. If the frequency offset between signals CLK64 and REFCLK is greater than ±480 ppm, no edge appears on signals REFDIV and REFDIVB while pulse LCK0L is present, and therefore this pulse is not registered in flip-flop 502. Therefore, signal LCK1 supplied by flip-flop 520 is configured to indicate whether an-in-lock or out-of-lock condition exists.

To increase reliability, validation circuit 500 is further adapted to include three more flip-flops, namely flip-flops 504, 506 and 508, as seen from FIG. 5. Pulse signal LCK1—which is a delayed replica of signal LCK0L—is registered in flip-flop 504 if an edge appears on each of signals REFDIV and REFDIVB during the time when pulse LCK1 is present. Pulse signal LCK2—which is a delayed replica of signal LCK1—is registered in flip-flop 506 if an edge appears on each of signals REFDIV and REFDIVB during the time when pulse LCK2 is present. Pulse signal LCK3—which is a delayed replica of signal LCK3—is registered in flip-flop 508 if an edge appears on each of signals REFDIV and REFDIVB during the time when pulse LCK3 is present. Therefore, in accordance with the embodiment shown in FIG. 5, each of signals REFDIV and REFDIVB is required to have four edges while pulses LCK0L, LCK1, LCK2 and LCK3 are present to detect in-lock conditions.

Each of signals LCK1, LCK2, LCK3 and LCK4 is applied to a different input terminal of 4-input NAND gate 510. If any of these four signals is at a logic low level, then signal LCK4B generated by NAND gate 510 is forced to a high logic level to indicate that an out-of-lock condition has been detected. Only if all four signals LCK1, LCK2, LCK3 and LCK4 are in high logic states, signal LCK4B is forced to a low logic state to detect in-lock conditions, as described further below. Signal LCK4B is applied to data input terminal D of flip-flop 512.

Flip-flop 512 includes two clock terminals CK and CKB. Clock terminal CKB receives signal RFCKB generated by inverter 514 which, in turn, receives input signal REFCLK. Clock terminal CK receives signal RFCK generated by inverter 516 which, in turn, receives signal RFCKB. Flip-flop 512 generates signal LCK4LB at its Q output terminal. Signal LCK4LB is therefore a delayed replica of signal LCK4B except that it does not have any glitches that may appear on signal LCK4B. In other words, flip-flop 512 removes any glitches that may be present on signal LCK4B before passing this signal from its input terminal to its output terminal. Signal LCK4LB is supplied to control logic 600 which also receives signals REFCLK and CLK64, as described further below.

Figure 6:
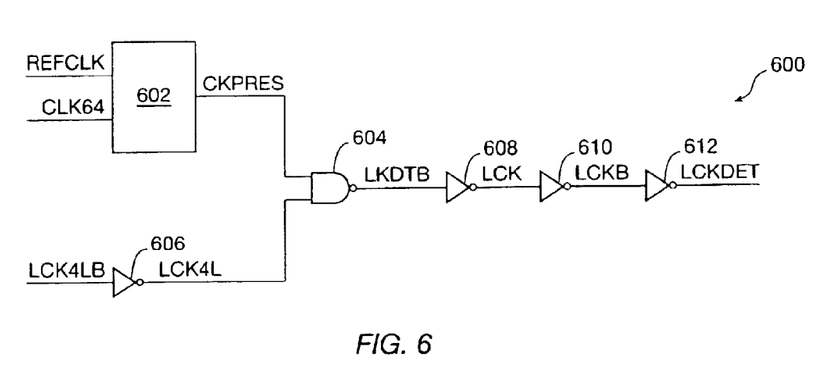
FIG. 6 is a logic gate diagram of the control logic block of FIG. 3, in accordance with one embodiment of the present invention.

Control logic 600 includes logic block 602, NAND gate 604 and inverters 606, 608, 610 and 612. Logic block 602 receives signals REFCLK and CLK64 and generates signal CKPRES. Logic block 602 forces signal CKPRES to a logic high state if signal REFCLK is an active clock signal, otherwise Logic block 602 forces signal CKPRES to a logic low. Therefore, a logic high state on signal CKPRES indicates that signal REFCLK is an active clock signal and a logic low state on signal CKPRES indicates that signal REFCLK is an inactive clock signal. Signal CKPRES is applied to a first input terminal of NAND gate 604. A second input terminal of NAND gate 604 receives signal LCK4L which is the inverse of signal LCK4LB generated by inverter 606. Accordingly, assuming that signal LC4LB is in a logic low state, if clock signal REFCLK is detected as being active by logic block 602, signal LCKDET generated by control logic 600 is forced to a logic high state to indicate that a lock has been acquired. On the other hand, assuming that signal LC4LB is in a logic low state, if signal REFCLK is detected as being inactive by logic block 602, signal LCKDET is forced to a logic low state to indicate that no lock has been acquired.

After, signal CLK64 is detected as being frequency locked to signal REFCLK, i.e., after signal LCKDET is asserted to a logic high state, lock-detect circuit 30 switches to data acquisition mode to check whether the frequency of incoming data is locked to that of signal REFCLK. When lock-detect circuit 30 switches to data acquisition mode CLK64 may lose its lock to signal REFCLK. The incoming data frequency is not detected as being locked to the frequency of signal REFCLK until two cycles of signal REFDIV later. In other words, even if signal LCKDET is at a logic high state, lock-detect circuit 30 does not output a lock-detect signal DLYDLKDT until two consecutive transitions are observed on signal REFDIV to further verify the detection.

To achieve data acquisition, a phase-locked loop (not shown) operates to receive the incoming data and generate signal CLK64 from the incoming data. Therefore, the frequency of signal CLK64 as generated by this phase-locked loop is derived from the frequency of the incoming data Accordingly, lock-detect circuit 30 detects whether the data-derived signal CLK64 is locked to signal REFCLK.

Figure 7:
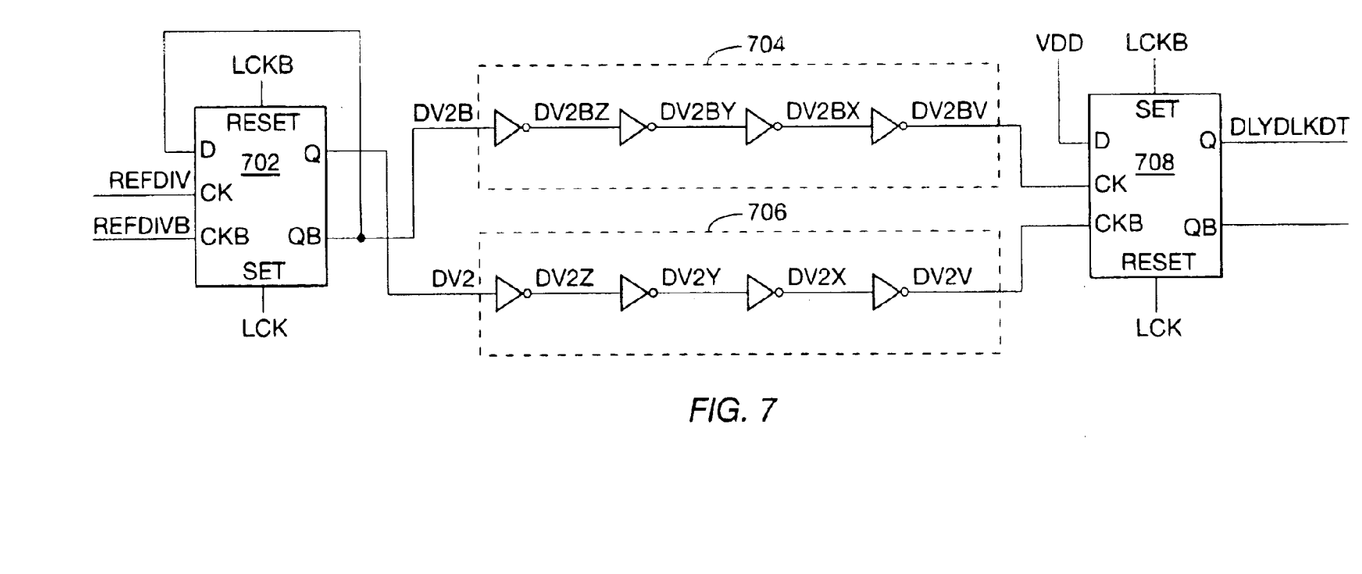
FIG. 7 is a logic gate diagram of the data acquisition block of FIG. 3, in accordance with one embodiment of the present invention.

Data acquisition block 700, shown in FIG. 7, is adapted to detect whether signal CLK64 as derived from incoming data is locked to signal REFCLK Data acquisition block 700 includes flip-flop 702, inverter chains 704, 706 and flip-flop 708. Signals LCK and LCKB are respectively applied to set and reset input terminals of flip-flop 708. The data input terminal D of flip-flop 708 is coupled to the power supply VDD which supplies, e.g., 1.8 volts. Signals REFDIV and REFDIVB are respectively applied to clock input terminals CK and CKB of flip-flop 702. Signals LCK and LCKB are respectively applied to set and reset terminals of flip-flop 702. Output terminal Q of flip-flop 702 is coupled to the input terminal of inverter chain 706. Output terminal QB of flip-flop 702 is coupled to the input terminal of inverter chain 704. The output terminal of inverter chain 704 is coupled to the clock input terminal CK of flip-flop 708 and the output terminal of inverter chain 706 is coupled to the clock input terminal CKB of flip-flop 708.

When signals LCK and LCKB are respectively in low and high logic states, the data present at output terminals Q of flip-flops 702 and 708 are zero. In other words, when control logic 600 forces signal LCKDET to a logic low state to indicate that signal CLK64 is not locked to signal REFCLK, both flip-flops 702 and 708 are reset. When control logic 600 detects a lock and places signal LCKDET in a logic high state, thereby disengaging flip-flops 702 and 708 from their respective reset positions, transitions on signals REFDIV and REFDIVB are enabled to propagate from flip-flop 702 to flip-flop 708.

As described above, a transition occurs on each of signals REFDIV and REFDIVB when counter 402 reaches the count of 0 from the count of $2^{14}$. After the occurrence of two transitions on signals REFDIV and REFDIVB, clock input terminals CK and CKB of flip-flop 708 clock in the logic high that is present on terminal D of flip-flop 708, thereby enabling signal DLYDLKDT to transition to a high logic state. In other words, data acquisition block 700 is configured to wait for two full count-down cycles of counter 402 before it forces signal DLYDLKDT to a logic high state to indicate that the data-derived signal CLK64 is locked to signal REFCLKY If during these two count-down cycles, signals LCK and LCKB are respectively forced to logic low and logic high states to indicate that signal CLK64 has lost its lock to signal REFCLK, signal DLYDLKDT remains in a logic low state to indicate that no lock has been acquired. Similarly, if signal CLK64 loses its lock to signal REFCLK after signal DLYDLKDT is placed in a logic high state, because signals LCK and LCKB are applied to reset and set terminals of flip-flop 708, shortly thereafter signal DLY-DLKDT is forced to a low logic state to indicate the loss of lock.

The above embodiments of the present invention are illustrative and not limiting. Various alternatives and equivalents are possible. The invention is not limited by the size of the frequency detect window used to determine in-lock and out-of-lock conditions. The invention is not limited by the number of counter bits or the type of the counters used for comparing the frequencies of the reference and VCO clock signals. Nor is the invention limited by the frequency of the reference or the VCO clock signals. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present invention and are intended to fall within the scope of the appended claims.

What is claimed:

1. A lock-detect circuit comprising:
   means for generating a user-configurable signal for selecting between a first mode of operating the circuit and a second mode of operating the circuit;
   means for generating a first pulse and a second pulse based on the selected mode of operating the circuit;
   means for determining whether an input signal is in-lock with a reference signal based on the first pulse; and means for determining whether the input signal is out-of-lock with the reference signal based on the second pulse.

2. The lock-detect circuit of claim 1, wherein a width of the first pulse is equal to a width of the second pulse when the circuit is selected to operate in the first mode.

3. The lock-detect circuit of claim 1, wherein the first and second pulses have differing widths when the circuit is selected to operate in the second mode.

4. The lock-detect circuit of claim 1 further comprising:
a first counter receiving the input signal; and
a second counter receiving the reference signal, wherein the first counter beings counting in response to receiving a trigger signal generated by the second counter.

5. The lock-detect circuit of claim 4, wherein the first and second counter begin counting in response to being synchronized to each other.

6. The lock-detect circuit of claim 5, wherein the first and second counters are down-counters.

7. The lock-detect circuit of claim 5, wherein the first and second counters are up-counters.

8. The lock-detect circuit of claim 4, wherein the second counter generates a count signal indicative of whether the second counter has reached a predefined count.

9. The lock-detect circuit of claim 8, wherein the predefined count is zero.

10. The lock-detect circuit of claim 1, wherein the means for determining whether the input signal is out-of-lock with the reference signal comprises means for determining whether the input signal has lost a previously acquired lock to the reference signal.

11. The lock-detect circuit of claim 1 further comprising:
means for generating a third pulse having a width different from widths of the first and second pulses, wherein the third pulse is operative to detect whether the input signal has lost a previously acquired lock to the reference signal.

12. The lock-detect circuit of claim 11, wherein each of the first, second, and third pulse widths are programmable.

* * * * *